(12) United States Patent
Watanabe et al.

(10) Patent No.: US 6,636,391 B2
(45) Date of Patent: Oct. 21, 2003

(54) MAGNETORESISTIVE SENSOR, MAGNETIC HEAD AND MAGNETIC DISK APPARATUS

(75) Inventors: Katsuro Watanabe, Odawara (JP); Yoshiaki Kawato, Hachioji (JP); Reiko Arai, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 282 days.

(21) Appl. No.: 09/811,482

(22) Filed: Mar. 20, 2001

(65) Prior Publication Data

US 2001/0040777 A1 Nov. 15, 2001

(30) Foreign Application Priority Data

Apr. 6, 2000 (JP) .................................... 2000-104359

(51) Int. Cl.[7] .................... G11B 5/127; G11B 5/33; G11B 5/39
(52) U.S. Cl. .................... 360/321; 360/324.12
(58) Field of Search .................... 360/324.12, 321, 360/324.1, 324.2, 313, 110, 324

(56) References Cited

U.S. PATENT DOCUMENTS

| | | | | | |
|---|---|---|---|---|---|
| 4,898,547 | A | * | 2/1990 | Bottoms et al. ........ | 360/324.2 |
| 5,898,547 | A | * | 4/1999 | Fontana, Jr. et al. ..... | 360/324.2 |
| 2001/0026423 | A1 | * | 10/2001 | Arai et al. .............. | 360/321 |
| 2002/0135949 | A1 | * | 9/2002 | Gill ........................ | 360/324.2 |

FOREIGN PATENT DOCUMENTS

| JP | 3154217 | 7/1991 |
|---|---|---|
| JP | 08167118 | 6/1996 |
| JP | 10334418 | 12/1998 |

OTHER PUBLICATIONS

Journal Of magnetism and Magnetic Materials 139 (1995) L231–L234; T. Miyazaki, N. Tezuka.

* cited by examiner

Primary Examiner—Julie Anne Watko
(74) Attorney, Agent, or Firm—Antonelli, Terry, Stout & Kraus, LLP

(57) ABSTRACT

A magnetoresistive sensor employing a magnetoresistive sensor film of a GMR film or a TMR film and a magnetic flux guide to ensure high sensitivity and high stability. Magnetization of a magnetic flux guide and a first ferromagnetic layer, which is a free layer of a GMR sensor film or a TMR sensor film, are made to antiferromagnetically couple to each other via a nonmagnetic intermediate layer 21. Since net magnetic moment has become small in the area in which the magnetoresistive sensor film is arranged, and an angle of magnetization of the ferromagnetic layer rotated by magnetic field which has been guided by the magnetic flux guide enlarges, high sensitivity can be obtained. When a longitudinal biasing layer is provide for the magnetic flux guide, longitudinal biasing magnetic field is applied to the ferromagnetic layer as well which is antiferromagnetically coupled to the magnetic flux guide, thus being able to suppress Barkhausen noise of both the magnetic flux guide and the ferromagnetic layer.

15 Claims, 9 Drawing Sheets

Ferromagnetic Coupling

Antiferromagnetic Coupling

Distance from the air bearing surface

Distance from the air bearing surface

Distance from the air bearing surface

Distance from the air bearing surface

MAGNETORESISTIVE SENSOR, MAGNETIC HEAD AND MAGNETIC DISK APPARATUS

BACKGROUND OF THE INVENTION

1. Field of the Invention

The present invention relates to a magnetoresistive sensor sensitive for magnetic field, a magnetic head for reading information, which has been magnetically recorded, by the use of the magnetoresistive sensor as a read-back element, and a magnetic disk apparatus.

2. Related Art.

An improvement in the magnetic disk apparatus, in particular, in recording density of the magnetic disk apparatus is remarkable, and there have been demands for a high read output in a read-head which is a key device of the magnetic disk apparatus. In order to obtain a high read output in a high recording density, a gap between a magnetic recording disk and a magnetic head, head flying height, has become small. The current head flying height is approximately 30 nm, but it will be yet smaller hereafter, and it is expected that the magnetic head will be in a quasi-contact state in which it flies in an almost contact state with the magnetic recording disk or will be in a contact state in which it will really come into contact with the magnetic recording disk. In this case, it is thought that damage to the giant magnetoresistive (GMR) film occurs due to wear when a GMR film, which is a read-back element, is exposed to an air bearing surface of the magnetic head. As a technique for avoiding this trouble, for example, the magnetic head provided with a magnetic flux guide which extends towards a depth direction from the air bearing surface is disclosed in Japanese Patent Laid-Open No. 10-334418. In this magnetic head, a ferromagnetic layer (a free layer) of the GMR film whose magnetization direction changes in response to an external magnetic field is directly laminated on a part of the magnetic flux guide so that magnetization of the free layer is ferromagnetically coupled to that of the magnetic flux guide.

Additionally, a feasibility study has been also carried out for a high output in a magnetoresistive sensor film. Recently, a magnetoresistive (MR) head utilizing a magnetoresistive effect has been employed as the read-head. In the case of a recording density of several $Gb/in^2$, the MR head utilizing an anisotropic magnetoresistive effect, AMR head, has been employed, however, the MR head utilizing a giant magnetoresistive effect, GMR head, is employed in the case of a higher recording density than it since the AMR effect lacks in sensitivity.

However, in order to further improve the recording density A hereafter, a still larger read output than the current one becomes necessary. For this end, research and development on a new magnetoresistive film superior to the GMR film has been actively carried out, and as one of the promising candidates, attention is paid to a ferromagnetic tunneling magnetoresistive (TMR) film in which a tunnel barrier layer is interposed between two ferromagnetic layers. With respect to the TMR film, for example, Journal of Magnetism and Magnetic Materials issued in 1995, vol.139, pp. L231 to L234 reported that a MR ratio of approximately 18% was obtained at room temperature in the constitution in which an Al oxide film was interposed between two Fe layers. Furthermore, Japanese Patent Laid-Open No. 3-154217 discloses the MR head employing the TMR film as the magnetoresistive sensor film.

SUMMERY OF THE INVENTION

Japanese Patent Laid-Open No. 10-334418 discloses the GMR head in which magnetization of a free layer is magnetically coupled to that of the magnetic flux guide by directly laminating the ferromagnetic layer (the free layer) of the GMR film, whose magnetization direction changes in response to an external magnetic field, on a part of the magnetic flux guide film. In this case, the magnetic coupling is ferromagnetic one. In this structure, magnetization of the magnetic flux guide rotates in response to a magnetic field from a medium, and thereby magnetization of the free layer ferromagnetically coupled to that of the magnetic flux guide also rotates, and the relative angle of magnetization to the ferromagnetic layer (a pinned layer) of the GMR film, whose magnetization direction is not changed by the external magnetic field, varies to generate resistance change. However, there is the problem that in the area of where the magnetic flux guide and the free layer are ferromagnetically coupled, which serve as the origin of the resistance change, magnetization rotation becomes difficult as compared with the area of the magnetic flux guide in which no free layer exists due to a large net magnetic moment, resulting in a lowering of sensitivity and difficulty with an improvement of the read output.

By the way, there are the problems to be solved in application of the TMR film to the MR head. The constitutions of the magnetoresistive sensor films for the MR head utilizing the AMR effect and the GMR effect are, for example, a transversal biasing layer/a nonmagnetic conductive layer/an AMR ferromagnetic layer and a free layer/a nonmagnetic conductive layer/a pinned layer/an antiferromagnetic layer respectively, and in general all the layers comprise the metal film. On the other hand, with respect to the TMR layer, the basic constitutions are a free layer/a tunnel barrier layer/a pinned layer, and among these, the tunnel barrier layer is a metal oxide layer with a thickness equal to several nm or less. It is necessary to fabricate the head so that the tunnel barrier layer does not short-circuit in the process for fabricating the head since the TMR is generated by a tunnel effect of electrons between the ferromagnetic layers via this tunnel barrier layer, and thus the technology peculiar to the TMR head, which is different from that of the conventional MR head, is required for the process for arranging and fabricating the longitudinal biasing layer for suppressing a Barkhausen noise of the free layer.

There is no description as to the longitudinal biasing layer, which is indispensable to a stable head motion, in the foregoing Journal of Magnetism and Magnetic Materials, vol.139, pp. L231 to L234 and Japanese Patent Laid-Open No. 3-154217.

Additionally, with respect to the AMR film and the GMR film currently used for the MR head, a sensing current flows in the in-plane direction of these films, on the other hand, with respect to the TMR film, the sensing current flows perpendicular to the film plane. Accordingly, there is the problem that resistance of the TMR element increases as the element size becomes small, resulting in increase in noise.

Furthermore, in the structure in which the magnetoresistive sensor film is exposed to the air bearing surface like that of the conventional MR head, there is also the problem that the two ferromagnetic layers which are arranged above and below the tunnel barrier layer respectively might short-circuit in a lapping processing of the air bearing surface, thus necessitating an extremely fine lapping technique.

Application of the structure disclosed in Japanese Patent Laid-Open No. 10-334418 to the TMR film allows the element size to enlarge, which makes it possible to reduce resistance of the element and there is no possibility for the short circuit since the barrier layer is not exposed to the air bearing surface. So it is thought that these problems can be overcome, but the problem still exists in the sensitivity decrease as described above.

SUMMARY OF THE INVENTION

Objects of the present invention is to improve sensitivity in the structure using the magnetic flux guide without exposing the magnetoresistive sensor films such as the GMR film and the TMR film to the air bearing surface, and to provide the magnetoresistive sensor having high sensitivity and high stability by applying the longitudinal biasing field to both of the magnetic flux guide and the free layer of the magnetoresistive film. Another object of the present invention is to provide the high-sensitivite magnetic head employing the magnetoresistive sensor having high sensitivity and high stability as the read-back element, and the magnetic disk apparatus with a high recording density, which mounts the same magnetic head.

In order to accomplish the above-mentioned objects, the present invention employs the structure of the magnetoresistive sensor described below. Firstly, to obtain high sensitivity, the structure was employed in which the magnetic flux guide for guiding leakage flux from a magnetic recording medium to the magnetoresistive sensor film was made to be antiferromagnetically coupled via a nonmagnetic intermediate layer to a fist ferromagnetic layer (the free layer or the layer in contact with a intermediate layer in case the free layer is the laminated structure), whose magnetization direction rotates in response to magnitude of the applied magnetic field, out of a plurality of the magnetic layers constituting the magnetoresistive sensor film. Furthermore, in order to realize high stability, the structure was employed in which the longitudinal biasing layer for suppressing a Barkhausen noise was provided for the magnetic flux guide. The antiferromagnetic coupling of the magnetic flux guide to the first ferromagnetic layer of the magnetoresistive film via the nonmagnetic intermediate layer allows the longitudinal biasing magnetic field, which has been applied to the magnetic flux guide, can be applied to the first ferromagnetic layer of the magnetoresistive sensor via the nonmagnetic intermediate layer.

Specifically, the magnetoresistive sensor in accordance with the present invention is characterized by comprising: the magnetoresistive sensor film having the ferromagnetic layer whose magnetization rotates in response to magnitude of the applied magnetic field; a pair of electrodes for flowing the signal sensing current to the magnetoresistive sensor film; and the magnetic flux guide for guiding the leakage flux from the magnetic recording medium to the magnetoresistive film, in which the ferromagnetic layer of the magnetoresistive sensor film whose magnetization rotates in response to magnitude of the applied magnetic field is antiferromagnetically coupled to the magnetic flux guide.

The magnetoresistive sensor film is arranged inside the element without being exposed to the air bearing surface and the magnetic flux guide whose end is exposed to the air bearing surface extends in the depth direction over the position of the magnetoresistive sensor film.

The magnetoresistive sensor in accordance with the present invention is characterized by comprising: the magnetoresistive sensor film having the ferromagnetic layer whose magnetization rotates in response to magnitude of the applied magnetic field; a pair of the electrodes for flowing the signal sensing current to the magnetoresistive sensor film; and the magnetic flux guide for guiding the leakage flux from the magnetic recording medium to the magnetoresistive sensor film, in which the ferromagnetic layer of the magnetoresistive sensor film whose magnetization rotates in response to magnitude of the applied magnetic field is antiferromagnetically coupled to the magnetic flux guide via the nonmagnetic intermediate layer made of Ru, Cr, Rh, Ir or alloys thereof.

A piece of the magnetic film can constitute the magnetic flux guide portion. Additionally, a first magnetic flux guide portion and a second magnetic flux guide portion can constitute the magnetic flux guide. In this case, the first magnetic flux and the second magnetic flux guide portions are made to be continuous from the air bearing surface into the depth direction, and to be magnetically connected at a position further from the air bearing surface than that of the magnetoresistive sensor film.

It is preferable to provide the longitudinal biasing layer for suppressing the Barkhausen noise for the magnetic flux guide. The longitudinal biasing field is substantially applied to the ferromagnetic layer, which is antiferromagnetically coupled to the magnetic flux guide by providing the longitudinal biasing layer for the magnetic flux guide for suppressing the Barkhausen noise.

The longitudinal biasing layer can be provided by laminating the magnetic flux guide thereon in the region or nearly the same region including its region, in which the ferromagnetic layer whose magnetization rotates in response to magnitude of the applied magnetic field is in contact with the magnetic flux guide via the nonmagnetic intermediate layer. Additionally, the longitudinal biasing layers can be provided for the both track-width-direction ends of the magnetic flux guide. In the case where the magnetic flux guide comprises the first magnetic flux guide portion and the second magnetic flux guide portion, the longitudinal biasing layer may be provided between the first magnetic flux guide portion and the second magnetic flux guide portion.

The magnetoresistive sensor film comprises the first ferromagnetic layer and the second ferromagnetic layer which have been laminated via the tunnel barrier layer and can be made to be such a type of the magnetoresistive sensor in which the magnetization of the first ferromagnetic layer rotates in response to magnitude of the applied magnetic field, the relative angle of the magnetization direction of the first ferromagnetic layer to the second ferromagnetic layer varies and thereby electric resistance changes. Magnetization of the first ferromagnetic layer rotates in response to magnitude of the applied magnetic field, and the magnetization direction of the first ferromagnetic layer is at a certain angle with the magnetization direction of the second ferromagnetic layer when the applied magnetic field is zero, and the relative angle of the magnetization direction of the first ferromagnetic layer to the second ferromagnetic layer varies and thereby electric resistance changes.

The magnetoresistive sensor film can be made to be such a type of the magnetoresistive sensor film in which at least two ferromagnetic layers are laminated at least once via the nonmagnetic conductive layer, the relative angle of the magnetization direction of the adjacent ferromagnetic layer via the nonmagnetic conductive layer varies and then electric resistance changes.

Additionally, the magnetoresistive sensor film can also be made to be such a type of the magnetoresistive sensor film in which the first ferromagnetic layer and the second ferromagnetic layer have been laminated via the nonmagnetic conductive layer, the magnetization of the first ferromagnetic layer rotates in response to magnitude of the applied magnetic field, the magnetization direction of the second ferromagnetic layer is pinned to nearly the depth direction, the magnetization direction of the first ferromagnetic layer is at a certain angle with the magnetization direction of the second ferromagnetic layer when the applied magnetic field is zero, and the relative angle of the magnetization direction of the first ferromagnetic layer to the second ferromagnetic layer varies and thereby electric resistance changes.

The magnetic head in accordance with the present invention is characterized by including the read-head which comprises: the magnetoresistive sensor film having the ferromagnetic layer whose magnetization rotates in response to magnitude of the applied magnetic field; a pair of the electrodes for flowing the signal sensing current to said magnetoresistive sensor film; and the magnetic flux guide which is antiferromagnetically coupled to the ferromagnetic layer of the magnetoresistive sensor film whose magnetization rotates in response to magnitude of the applied magnetic field and for guiding the leakage flux from the magnetic recording medium to the magnetoresistive sensor film.

The magnetic head in accordance with the present invention is also characterized by including a read-head which comprises: the magnetoresistive sensor film having the first ferromagnetic layer whose magnetization rotates in response to magnitude of the applied magnetic field and the second ferromagnetic layer, which have been laminated via the tunnel barrier layer; a pair of the electrodes for flowing the signal sensing current to the magnetoresistive sensor film; and the magnetic flux guide which is antiferromagnetically coupled to the first ferromagnetic layer of the magnetoresistive sensor film via the nonmagnetic intermediate layer made of Ru, Cr, Rh, Ir or alloys thereof and for guiding the leakage flux from the magnetic recording medium to the magnetoresistive sensor film.

The magnetic head in accordance with the present invention is also characterized by including a read-head which comprises: the magnetoresistive sensor film having the first ferromagnetic layer and the second ferromagnetic layer, which have been laminated via the nonmagnetic conductive layer, the magnetization of the first ferromagnetic layer rotating in response to magnitude of the applied magnetic field, in which a relative angle of the magnetization direction of the first ferromagnetic layer to the magnetization direction of the second ferromagnetic layer varies and thereby the electric resistance changes; a pair of electrodes for flowing a signal sensing current to the magnetoresistive sensor film; and a magnetic flux guide antiferromagnetically coupling to the first ferromagnetic layer of the magnetoresistive sensor film via a nonmagnetic intermediate layer made of Ru, Cr, Rh, Ir, or alloys thereof and for guiding leakage flux from the magnetic recording medium to the magnetoresistive sensor film.

The longitudinal biasing layer for suppressing the Barkhausen noise is preferably provided for the magnetic flux guide. The magnetic head also preferably comprises an inductive thin-film recording head as the recording head.

The magnetic disk apparatus in accordance with the present invention is characterized in that in a magnetic recording system comprising the magnetic recording medium, the magnetic head having a recording unit and a read-back unit, driving means for allowing the magnetic head to make a relative motion to the magnetic recording medium, and read/write signal processing means, the read-back unit of the magnetic head comprises: the magnetoresistive sensor film having the ferromagnetic layer whose magnetization rotates in response to magnitude of the applied magnetic field; a pair of the electrodes for flowing the signal sensing current to the magnetoresistive sensor film; and the magnetic flux guide which is antiferromagnetically coupled to the ferromagnetic layer of the magnetoresistive sensor film whose magnetization rotates in response to magnitude of the applied magnetic field and for guiding the leakage flux from the magnetic recording media to the magnetoresistive sensor film.

The magnetoresistive sensor in accordance with the present invention is also characterized by comprising: the magnetoresistive sensor film in which the first ferromagnetic layer, the nonmagnetic layer, the second ferromagnetic layer, and the antiferromagnetic layer are formed in order; a pair of the electrodes for flowing the signal sensing current to the magnetoresistive sensor film; and the magnetic flux guide for guiding the leakage flux from the magnetic recording medium to the magnetoresistive sensor film, in which the first ferromagnetic layer and the magnetic flux guide are formed via the nonmagnetic intermediate layer made of Ru, Cr, Rh, Ir or alloys thereof. The nonmagnetic layer can be made to be the tunnel barrier layer.

The magnetic head in accordance with the present invention is also characterized by comprising: the magnetoresistive sensor film in which the first ferromagnetic layer, the nonmagnetic layer, the second ferromagnetic layer, and the antiferromagnetic layer are formed in order; a pair of electrodes for flowing the signal sensing current to the magnetoresistive sensor film; the magnetic flux guide for guiding the leakage flux from the magnetic recording medium to the magnetoresistive sensor film; and the nonmagnetic intermediate layer made of Ru, Cr, Rh, Ir or alloys thereof, which is formed between the magnetic flux guide and the first ferromagnetic layer. The nonmagnetic layer can be made to be the tunnel barrier layer.

DETAILED DESCRIPTION OF THE PREFERRED EMBODIMENTS

At first, difference was studied by the use of a model calculation between the case in which the magnetic flux guide and the first ferromagnetic layer are ferromagnetically coupled and the case in which they are antiferromagnetically coupled. The model for calculation is such that as drawings shown in the top part of FIGS. 1A and 1B, in the case where there is no magnetic shield for simplification, magnetic flux from a medium enters from an air bearing surface 1 to a magnetic flux guide 10 to allow magnetization of the first ferromagnetic layer 22 of the magnetoresistive sensor film to rotate, the first ferromagnetic layer 22 being ferromagnetically FIG. 1A and antiferromagnetically FIG. 1B coupled to the magnetic flux guide 10 via the nonmagnetic intermediate layer. CoFe is employed as the two ferromagnetic layers, and the film thickness is set at 5.6 nm for the magnetic flux guide 10 and at 3.3 nm for the first ferromagnetic layer 22. The nonmagnetic intermediate layer 21 is Ru: 1.4 nm in thickness in the case of the ferromagnetic coupling and Ru: 0.8 nm in the case of the antiferromagnetic coupling. However, the same result can be obtained when the two ferromagnetic layers are ferromagnetically and antiferromagnetically coupled irrespective of the specific film materials and the film thickness, and the condition on which the calculation result shown in FIGS. 1A and 1B can be obtained is not limited to the case of the above-mentioned specific examples.

Figure 1A:
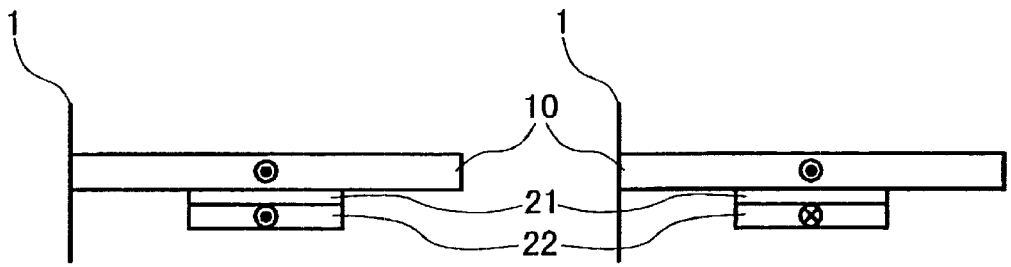
FIGS. 1A and 1B are drawings illustrating the result of a model calculation showing difference between a prior art and the present invention.
Figure 1B:
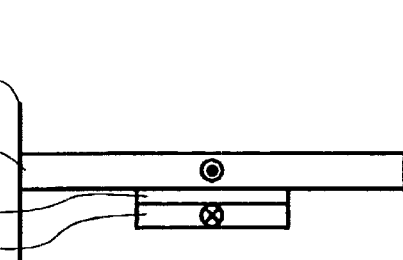
Figure 1B:
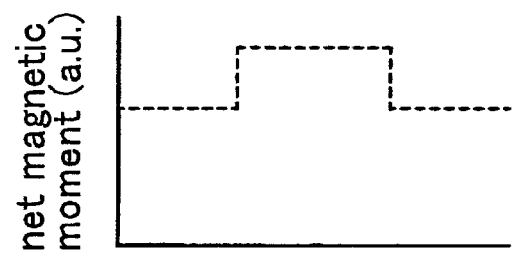
Figure 1B:
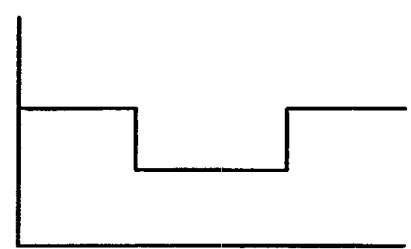
Figure 1B:
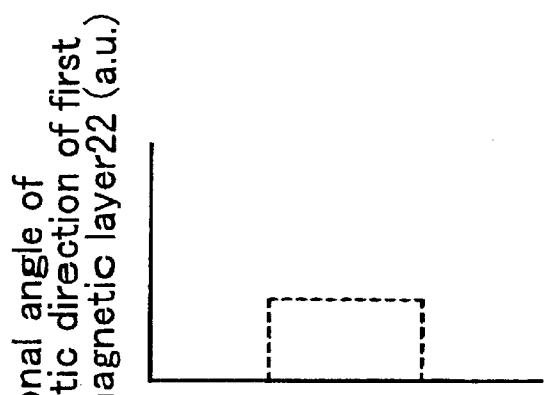
Figure 1B:
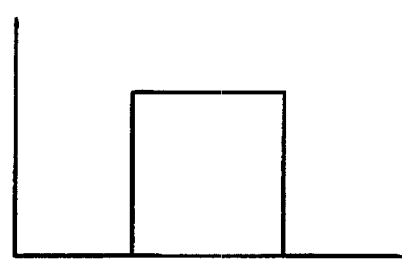

The middle part and the bottom part of FIGS. 1A and 1B qualitatively illustrate the net magnetic moment of the ferromagnetic materials on which entered magnetic flux acts, and the rotational angle of magnetization of the first ferromagnetic layer 22 respectively. Herein, the net magnetic moment is a product Bs·t of a saturation magnetic flux density Bs of the magnetic flux guide 10 and a film thickness t in the portion free of the first ferromagnetic layer 22, but it is a sum of Bs·t of the magnetic flux guide and that of the first ferromagnetic layer 22 in the case of the ferromagnetic coupling FIG. 1A, and it is a difference thereof in the case of antiferromagnetic coupling FIG. 1B.

Accordingly, in the case of the antiferromagnetic coupling FIG. 1B, the angle of magnetization which is rotated by the entered magnetic flux enlarges since the net magnetic moment becomes small in the portion to which the first ferromagnetic layer 22 is coupled as compared with the case of the ferromagnetic coupling FIG. 1A. This indicates that a high output can be obtained since the relative angle to magnetization of the pinned layer enlarges when observed as the GMR effect or the TMR effect by providing the pinned layer.

Next, an embodiment in accordance with the present invention will be described in conjunction with the accompanying drawings.

First Embodiment

Figure 2:
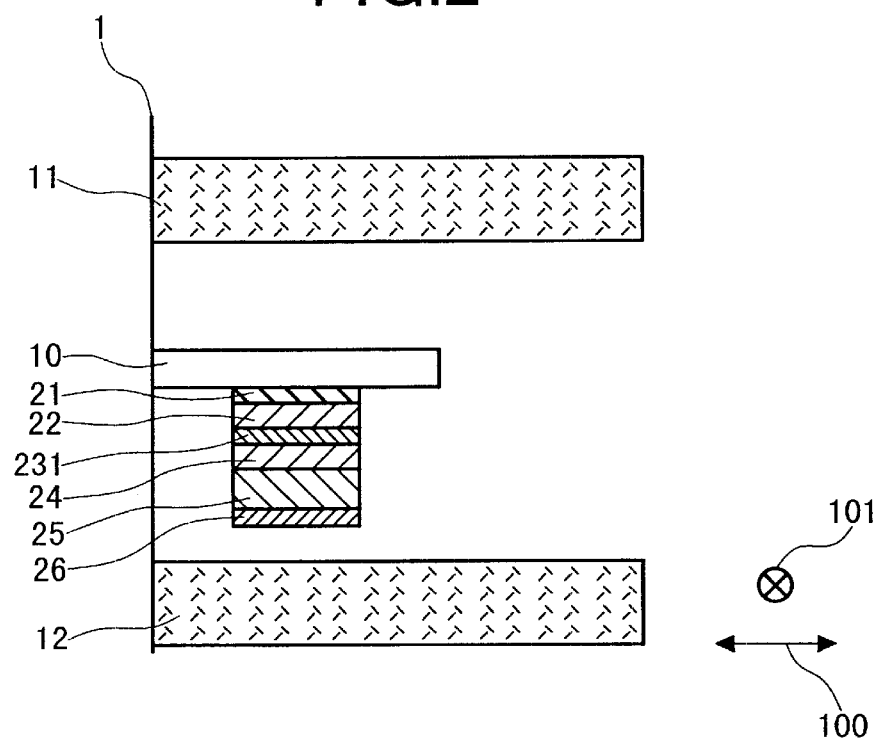
FIG. 2 is a cross sectional view illustrating one example of the magnetoresistive sensor in accordance with the present invention.

In FIG. 2, a cross sectional view of the magnetoresistive sensor in accordance with an embodiment of the present invention is shown. The reference numeral 1 denotes an air bearing surface 1, the reference numeral 100 denotes a depth direction and the reference numeral 101 denotes a track width direction in FIG. 2.

On a substrate (not shown), the magnetic flux guide 10 made of, for example, an $Ni_{81}Fe_{19}$ film with a film thickness of 10 nm was arranged between an upper shield layer 11 and a lower shield layer 12 which are made of, for example, an $Ni_{81}Fe_{19}$ film. The magnetic flux guide 10 extends from the air bearing surface 1 in the depth direction 100 and is antiferromagnetically coupled to the first ferromagnetic layer 22 which is the free layer of the GMR sensor film via the nonmagnetic intermediate layer 21 made of, for example, Ru with a film thickness of 0.8 nm in the separate position from the air bearing surface. Furthermore, the first ferromagnetic layer 22 is laminated over the second ferromagnetic layer 24 whose magnetization direction is pinned by the exchange coupling to the antiferromagnetic layer 25 via the nonmagnetic conductive layer 231. These layers such as the first ferromagnetic layer 22, the nonmagnetic conductive layer 231, the second ferromagnetic layer 24 and the antiferromagnetic layer 25 constitute the GMR sensor film.

Note that, in FIG. 2, an underlayer 26 is provided underneath the antiferromagnetic layer 25, but the underlayer 26 does not need to be provided in particular, if the exchange coupling between the second ferromagnetic layer 24 and the antiferromagnetic layer 25 is sufficient for a stable head motion. Additionally, insulating films such as a composite film of an aluminum oxide and a silicone oxide are formed between the magnetic flux guide 10 with the GMR sensor film and the upper shield layer 11, and between the magnetic flux guide 10 with the GMR sensor film and the lower shield layer 12.

Ni—Fe, Co, Co—Fe, Ni—Fe—Co and the laminated film thereof can be used for the first ferromagnetic layer 22 and the second ferromagnetic layer 24, but the material containing a large amount of Co is preferably used for an interface to the nonmagnetic conductive layer 231. Ag, Au, Cu and alloys thereof can be used for the nonmagnetic conductive layer 231, and Ir—Mn, Mn—Pt, Mn—Pd—Pt and Ni—Mn for the antiferromagnetic layer 25.

Cr, Rh, Ir and alloys thereof in addition to Ru can be used for the material of the nonmagnetic intermediate layer 21, and the film thickness generating antiferromagnetic coupling in these materials is in the range of approximately 0.4 nm to 5 nm, though depending on the material used. When these materials are used for the intermediate layer, the coupling between the two ferromagnetic layers above and below the intermediate layer is known to oscillate against the film thickness of the intermediate layer in such a manner: the ferromagnetic coupling; the antiferromagnetic coupling; the ferromagnetic coupling; the antiferromagnetic coupling and so on. The reason for it remains unknown, but it is said that it might be due to a Ruderman-Kittel-Kasuya-Yoshida interaction (RKKY interaction).

The longitudinal biasing layer (refer to FIG. 8 and FIG. 9) in which a CoCrPt film is formed on a Cr underlayer is provided for the both ends in the track width direction 101 of the GMR sensor film and the magnetic flux guide 10, and further on the longitudinal biasing layer, the electrode made of Ta is provided via TaW. Accordingly, the GMR sensor which acts stably can be obtained.

When the electrode is provided in the track width direction of the magnetic flux guide 10 in such a manner, since the sensing current divides and flows also to the magnetic flux guide film, a discontinuous multi-layer film of the magnetic material and the oxide, for example, a multi-layer film constituted of $Co_{90}Fe_{10}$: 1.5 nm and a silicone oxide: 1.0 nm may be used for the magnetic flux guide 10. The discontinuous multi-layer film of the magnetic material and the oxide can be obtained by preparing a magnetic-material target and an oxide target to alternately form the layers on the substrate by sputtering. With respect to the thin film, while a continuous film is formed when the film is comparatively thick, a discontinuous film called an island structure is formed when it is thin, which can be utilized to form the discontinuous multi-layer film.

By the way, the magnetization directions of the first ferromagnetic layer 22, which was the free layer, and the second ferromagnetic layer 24, which was the pinned layer, were controlled by performing heat treatment in the following way after completion of the film forming process of the read-back element (after formation of the upper shield layer 11). Firstly, after cooling the temperature in the magnetic field, which is higher than the temperature T1 at which the exchange coupling between the antiferromagnetic layer 25 and the second ferromagnetic layer 24 generates (T1 varies depending on the antiferromagnetic materials.) while applying, for example, the magnetic field of the maximum 15 kOe in the depth direction, the temperature is raised to below the T1 temperature and then cool the temperature while applying, for example, the magnetic field of 1 kOe in the track width direction. Thereby, the magnetization direction of the first ferromagnetic layer 22 can be directed nearly towards the track width direction, and the magnetization direction of the second ferromagnetic layer 24 can be directed nearly towards the depth direction.

The magnetic head used for the magnetic disk apparatus can be obtained by fabricating the reading element consisting of a pair of magnetic recording cores laminated via a recording gap on the magnetoresistive sensor described above. An evaluation of magnetic properties was carried out on the manufactured magnetic head. For comparison, the magnetic head of a comparison example 1 in which the magnetoresistive sensor film was exposed to the air bearing surface 1 (the structure without the magnetic flux guide 10) and the magnetic head of a comparison example 2 in which the magnetic flux guide 10 and the first ferromagnetic layer 22 were ferromagnetically coupled (the same head as the magnetic head of the embodiment 1 except that the film thickness of the nonmagnetic intermediate layer 21 is Ru: 1.4 nm and the magnetic flux guide 10 and the first ferromagnetic layer 22 are made to be ferromagnetically coupled) were fabricated to carry out the same evaluation. Note that, Bs·t of the magnetic flux guide 10 was set at 10 nm-T, and Bs·t of the first ferromagnetic layer 22 at 6 nm-T.

Table. 1 shows the measurement result of the head outputs on every 30 pieces of the magnetic heads of the present invention, the magnetic heads of the comparison example 1 and the magnetic heads of the comparison example 2 respectively. For the evaluation of the read-back properties, the read-back waveforms were measured by applying to the fabricated head with a magnetic flying height 18 nm and a pattern employed in this measurement was recorded at a recording density of approximately 6.7 $Gb/in^2$ (0.010 $Gb/mm^2$) on the magnetic recording medium of a CoCrPt system having properties of coercivity $H_c$: 4000 Oe and magnetization amount $M_r·t$: 0.4 T·nm respectively. Herein, $M_r$ is residual magnetization of the medium material, t is the film thickness, and the magnetic flying height means a gap between the CoCrPt layer surface of the medium and the utmost end of the magnetoresistive sensor film in the air bearing surface of the read-head.

TABLE 1

| Head No. | Outputs of heads of the present invention ($\mu$V) | Outputs of heads in which a magnetoresistive film is exposed to an air bearing surface ($\mu$V) | Outputs of heads in which a magnetic flux guide and a first ferromagnetic layer are ferromagnetically coupled ($\mu$V) |
|---|---|---|---|
| 1 | 1280 | 1350 | 420 |
| 2 | 1370 | 1250 | 450 |
| 3 | 1330 | 1450 | 430 |
| 4 | 1350 | 1350 | 440 |
| 5 | 1360 | 1360 | 450 |
| 6 | 1280 | 1280 | 440 |
| 7 | 1370 | 1450 | 410 |
| 8 | 1270 | 1270 | 420 |
| 9 | 1250 | 1180 | 450 |
| 10 | 1280 | 1280 | 440 |
| 11 | 1300 | 1440 | 410 |
| 12 | 1330 | 1280 | 430 |
| 13 | 1290 | 1300 | 420 |
| 14 | 1280 | 1310 | 440 |
| 15 | 1310 | 1290 | 450 |
| 16 | 1350 | 1290 | 430 |
| 17 | 1320 | 1220 | 420 |
| 18 | 1260 | 1350 | 440 |
| 19 | 1350 | 1340 | 450 |
| 20 | 1340 | 1350 | 420 |
| 21 | 1250 | 1290 | 440 |
| 22 | 1260 | 1300 | 420 |
| 23 | 1260 | 1280 | 420 |
| 24 | 1320 | 1420 | 440 |
| 25 | 1300 | 1300 | 430 |
| 26 | 1270 | 1370 | 440 |
| 27 | 1320 | 1340 | 430 |
| 28 | 1300 | 1350 | 450 |
| 29 | 1360 | 1200 | 430 |
| 30 | 1300 | 1280 | 440 |
| Average | 1310 | 1320 | 430 |
| Deviation | ±4.8% | ±10.6% | ±4.6% |

Comparing the average read-back outputs of the measured magnetic heads, the magnetic heads of the present invention obtained nearly the same outputs as the magnetic heads in which the magnetoresistive sensor was exposed to the air bearing surface, and on the other hand, the magnetic heads for comparison in which the magnetic flux guide 10 and the first ferromagnetic layer 22 were ferromagnetically coupled obtained only 30% of the output of the magnetic heads of the present invention. Additionally, comparing deviation of the read-out outputs of the magnetic heads of the present invention and that of the heads for comparison in which the magnetoresistive sensor was exposed to the air bearing surface, deviation of the former is ±4.8%, on the other hand, that of the latter is larger, ±10.6%. The reason why deviation of the latter enlarges is that MR element height varies due to variation in the lapping process of the air bearing surface when the magnetoresistive sensor film is exposed to the air bearing surface, thereby (1) resistance of the element changes, (2) three magnetic fields (the static magnetic field from the pinned layer, the interlayer coupling magnetic field between the pinned layer and the free layer, and the magnetic field generated by the sensing current.) which act to the free layer become unbalanced, resulting in losing the appropriate biasing state. On the other hand, with respect to the magnetic head of the present invention, even though the working process of the air bearing surface varies, the element height of the magnetoresistive sensor does not change, while the length of the air bearing surface side of the magnetic flux guide 10 varies and therefore element resistance or the biasing state hardly changes. Accordingly, in accordance with the present invention, the head can be fabricated having the read-out output equivalent to the magnetic head in which the magnetoresistive sensor film is exposed to the air bearing surface and the small property deviation.

Second Embodiment

Figure 3:
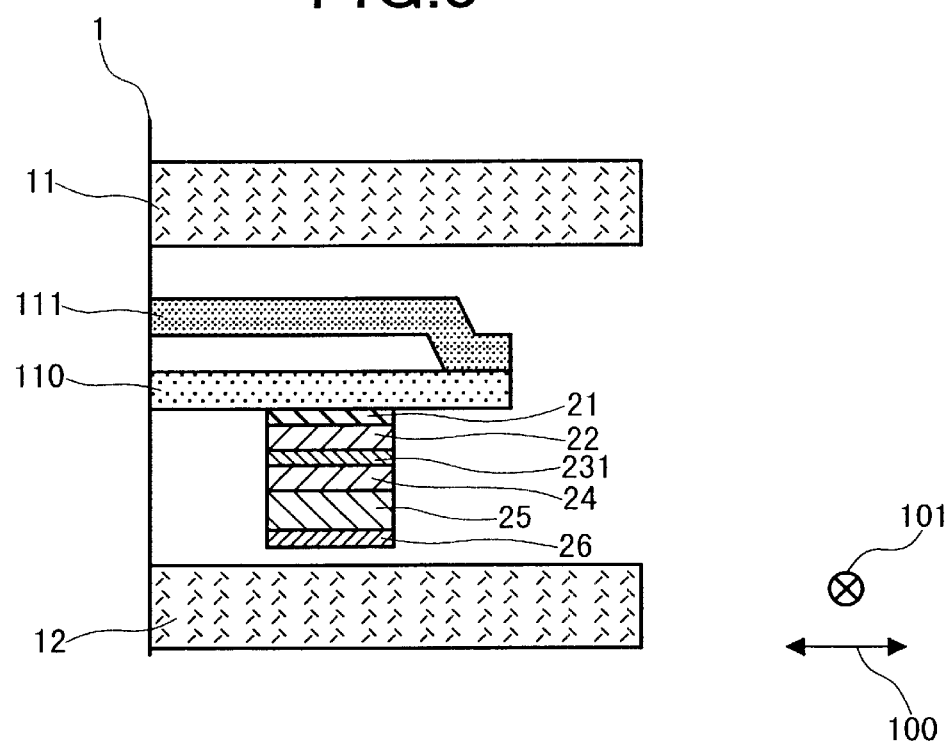
FIG. 3 is a cross sectional view illustrating another example of the magnetoresistive sensor in accordance with the present invention.

In the embodiment 1, only the magnetic flux guide 10 constitutes the magnetic flux guide, but as shown in FIG. 3, two portions of a first magnetic flux guide portion 110 and a second magnetic flux guide portion 111 may constitute the magnetic flux guide. One part of the first magnetic flux guide portion 110 is antiferromagnetically coupled to the first ferromagnetic layer 22 (free layer) of the GMR sensor film via the nonmagnetic intermediate layer 21. The first magnetic flux guide portion 110 and the second magnetic guide portion 111 are in contact at more remote position in the head depth direction than the position in which the GMR sensor film is arranged, these magnetic flux guide portions 110 and 111 forms the magnetic circuit, and the magnetic field which has entered from the medium passes through along the magnetic circuit.

Figure 17A:
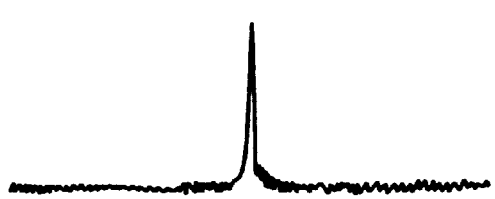
FIGS. 17A and 17B are drawings illustrating read-back waveforms of isolated signals.
Figure 17B:
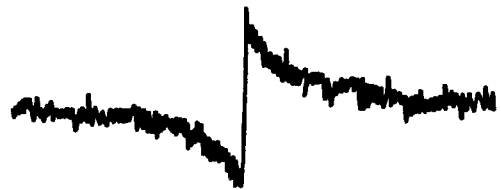

In such a constitution, a waveform like that the waveform read out by the magnetoresistive sensor of the embodiment 1 is differentiated can be obtained and thus it is preferred for readout of the perpendicular magnetic recording. FIGS. 17A,B show that the waveform when an isolated signal with a low recording density was read out by the magnetoresistive sensor of the embodiment 1 and the waveform when the isolated signal read out by the magnetoresistive sensor of the present embodiment whose structure is shown in FIG. 3. When the medium recorded perpendicularly is read out by the magnetic head having one piece of the magnetic flux guide 10 as shown in FIG. 2, the read-out waveform with two peaks of positive and negative (a double peaks waveform) can be obtained as shown in FIG. 17B. It separately necessitates a differentiating circuit for processing of this read-out signal, since the signal processing system for the magnetic disk apparatus has been designed so as to process a single peak waveform in which only one peak appears. However, since the single peak waveform can be obtained as shown in FIG. 17A when read out by the magnetic head having two pieces of the magnetic flux guide portions 110 and 111 as shown in FIG. 3, there is no need for designing/fabricating the signal processing system newly, which is preferred for the perpendicular magnetic recording.

Figure 4:
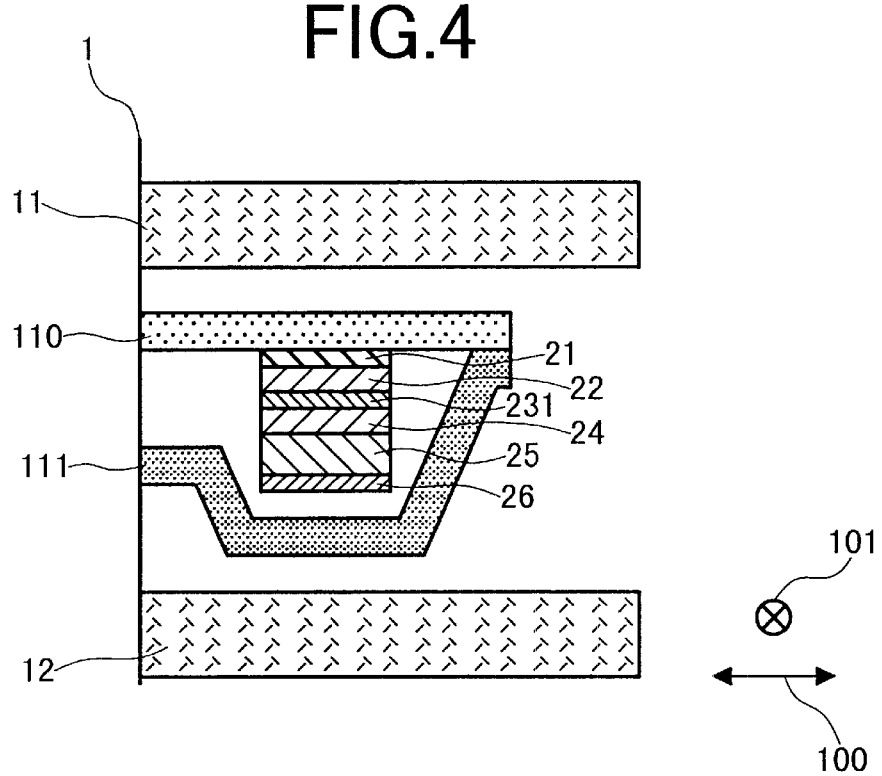
FIG. 4 is a cross sectional view illustrating another example of the magnetoresistive sensor in accordance with the present invention.

Additionally, the GMR sensor film may be arranged inside the magnetic circuit formed by the first magnetic flux guide portion 110 and the second magnetic flux guide portion 111 as shown in FIG. 4. The structure, in which the first magnetic flux guide portion 110 and the second magnetic flux guide portion 111 are formed between the upper shield layer 11 and the GMR sensor film as shown in FIG. 3, is easy to fabricate as compared with the structure in which the GMR sensor film is arranged inside the magnetic circuit formed by the first magnetic flux guide portion 110 and the second magnetic flux guide portion 111 shown in FIG. 4, but fabricating the head with a high recording density becomes difficult, since a gap between the upper shield layer 11 and the lower shield layer 12 can not be narrowed. On the other hand, the structure as shown in FIG. 4 is difficult to fabricate but has an advantage that the gap between the upper shield layer 11 and the lower shield layer 12 can be narrowed since the thickness of (the GMR sensor film and the magnetic flux guide) can be thinned by the extent caused by the GMR sensor film being arranged in the magnetic flux guide.

Herein, in the case of the GMR sensor, since the sensing current is flown into the film plane, the sensing current divides to the first and the second magnetic flux guides 110 and 111 as well, which contact to the GMR magnetoresistive film, resulting in the decrease in output. Therefore, these are desirably formed by a soft magnetic layer having a high electric resistance, for example, the discontinuous multilayer film of the magnetic material and the oxide as mentioned above.

Third Embodiment

Figure 5:
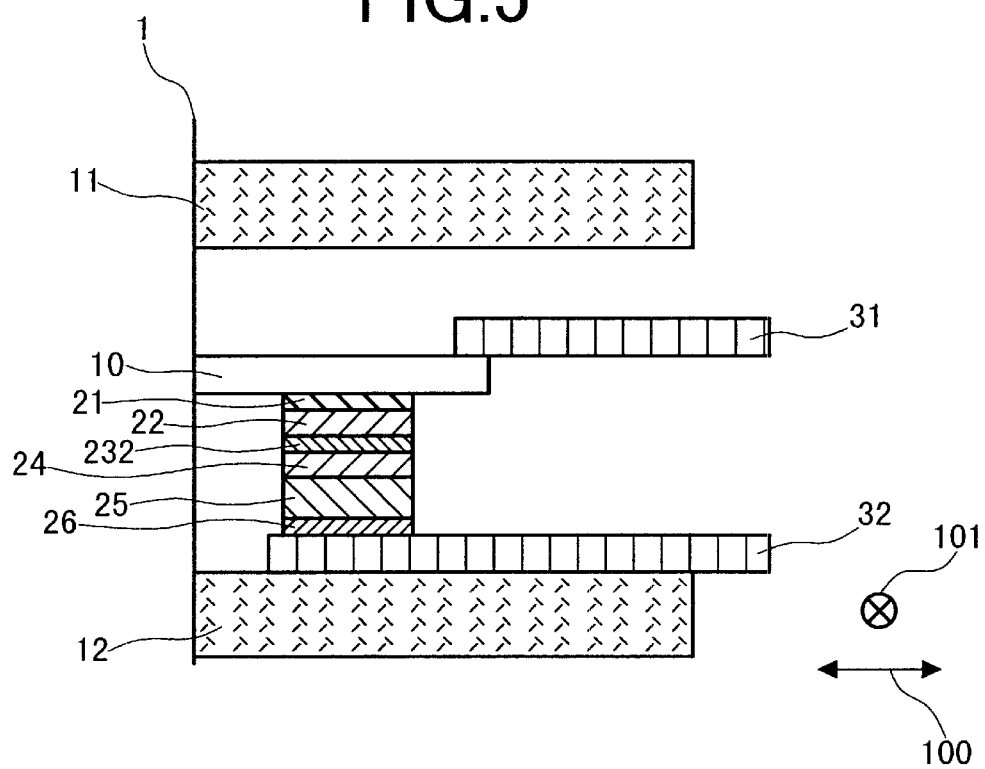
FIG. 5 is a cross sectional view illustrating another example of the magnetoresistive sensor in accordance with the present invention.

FIG. 5 is a view illustrating a basic constitution of the magnetoresistive sensor of another embodiment in accordance with the present invention. In the present embodiment, the TMR film is employed as the magnetoresistive sensor film.

The magnetic flux guide is arranged between the upper shield layer 11 and the lower shield layer 12 in a similar manner to the embodiment 1, and the magnetic flux guide 10 is provided at the position which is more remote in the head depth direction 100 from the air bearing surface 1 than the position in which the TMR magnetoresistive sensor film is arranged. Magnetization of the first ferromagnetic layer 22, which is the free layer of the TMR sensor film, is antiferromagnetically coupled to magnetization of the magnetic flux guide 10 via the nonmagnetic intermediate layer 21. Furthermore, the first ferromagnetic layer 22 and the second ferromagnetic layer 24 whose magnetization direction is pinned by the exchange coupling to the antiferromagnetic layer 25 are laminated via the tunnel barrier layer 232. The first ferromagnetic layer 22, the tunnel barrier layer 232, the second ferromagnetic layer 24 and the antiferromagnetic layer 25 constitute the TMR sensor film.

The underlayer 26 is provided underneath the antiferromagnetic layer 25, but it does not need to be provided in particular, if the exchange coupling between the second ferromagnetic layer 24 and the antiferromagnetic layer 25 is sufficient for a stable head motion. However, a lower electrode 32 is connected to the underlayer 26 to flow the sensing current in the film-thickness direction of the TMR sensor film. Accordingly, the underlayer 26 plays a role of one part of the electrode, furthermore also plays a role for adjustment of a gap between the upper shield layer 11 and the lower shield layer 12 by means of the total thickness of the underlayer 26 and the lower electrode 32. Furthermore, the lower electrode 32 is connected to the lower shield layer 12, which is used as one part of the lower electrode. On the other hand, an upper electrode 31 is connected to one part of the magnetic flux guide 10.

Ni—Fe, Co, Co—Fe, Ni—Fe—Co and the laminated film thereof can be used for the first ferromagnetic layer 22 and the second ferromagnetic layer 24 in similar manner to the embodiment 1, but the material having a large spin polarization is desirably used for an interface to the tunnel barrier layer 232. Ir—Mn, Mn—Pt, Mn—Pd—Pt and Ni—Mn can be used for the antiferromagnetic layer 25. In addition, Ru, Cr, Rh, Ir and alloys thereof can be used for the nonmagnetic intermediate layer 21, and the film thickness thereof is in the range of approximately 0.4 nm to 5 nm. The oxide of metal selected from the groups Al, Si, Ti, V, Cr, Zr, Nb, Hf and Ta and mixtures thereof can be used for the tunnel barrier layer 232, and the thickness thereof is 0.5 nm to 3.0 nm.

Note that insulating films such as a composite film of the aluminum oxide and the silicon oxide 32 are formed between the magnetic flux guide 10 with TMR sensor film and the upper electrode 31 and the upper shield layer 11, lower shield layer 12, or the lower electrode 32. The lower shield layer 12 does not always serve as the electrode as well, and the upper shield layer 11 can be used as one part of the electrode by connecting the upper electrode 31 to the upper shield layer 11.

Figure 6:
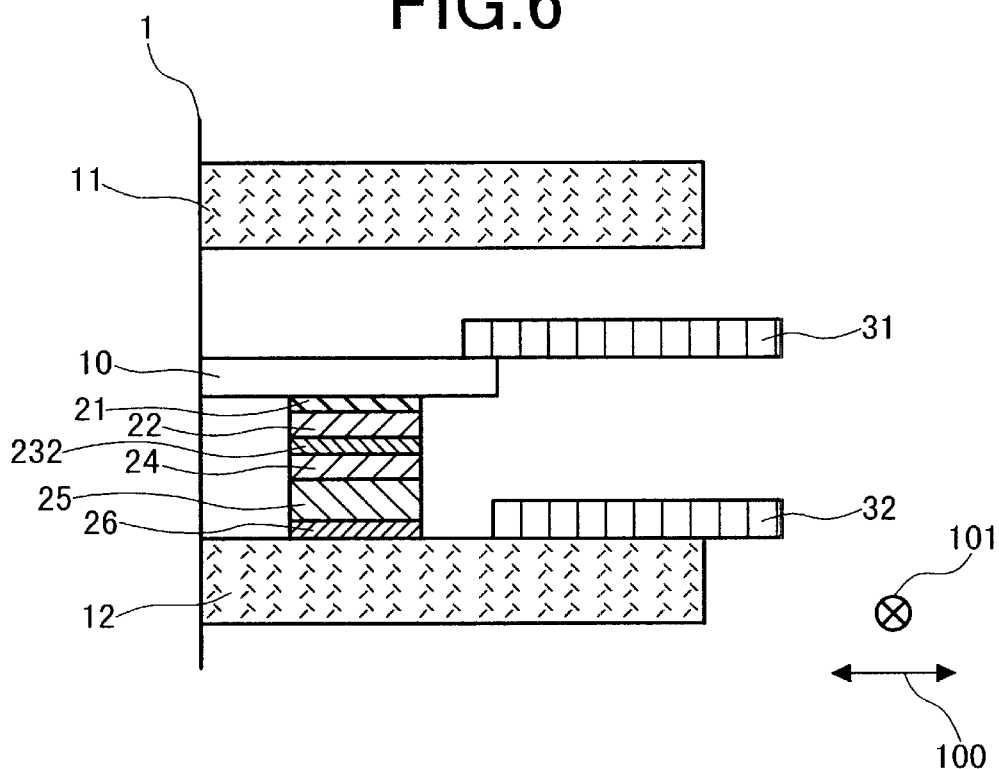
FIG. 6 is a cross sectional view illustrating another example of the magnetoresistive sensor in accordance with the present invention.

In the above-mentioned structure, the lower electrode 32 is arranged between the TMR sensor film and the lower shield layer 12, but the lower electrode 32 may be arranged in the vicinity of the TMR sensor film on the lower shield layer 12 as shown in FIG. 6, and furthermore, the lower shield layer 12 may serve as the electrode as well without providing the lower electrode.

In the magnetoresistive sensor using the TMR film, magnetization of the first ferromagnetic layer 22, which is the free layer of the TMR sensor film, is antiferromagnetically coupled to that of the magnetic flux guide 10 via the nonmagnetic intermediate layer 21 as shown in FIG. 5 and FIG. 6, the structure in which the TMR sensor film is arranged inside the sensor, is employed and thus the following merits can be expected as compared with the magnetoresistive sensor in which the TMR sensor film is exposed to the air bearing surface. That is, in the case of the TMR sensor film, the no output is obtained when the first ferromagnetic layer 22 and the second ferromagnetic layer 24, which are arranged above and below the tunnel barrier layer 232, short-circuit in the lapping process of the air bearing surface 1, however failures accompanying the lapping process can be considerably reduced in the structure shown in FIG. 5 or FIG. 6 since the TMR sensor film is not lapped at all even though the magnetic flux guide 10 is lapped in the lapping process.

Next, the structure will be described for applying the longitudinal biasing field in conjunction with FIG. 7 to FIG. 9. These are based on FIG. 5 or FIG. 6, and are obtained by adding the structure for applying the longitudinal biasing field. Note that, in these figures, the portion below the nonmagnetic intermediate layer 21 is a bird'-eye view and the upper portion above it is a partial cross-sectional view.

In the magnetoresistive sensor provided with the magnetic flux guide, it is no wonder to suppress the Barkhausen noise of the free layer of the magnetoresistive sensor film, and additionally it is necessary to apply the longitudinal biasing field to the magnetic flux guide as well since the free layer picks up a noise which has been generated in the magnetic flux guide as a signal as it is. In the present invention, since the first ferromagnetic layer 22, which is the free layer, and the magnetic flux guide 10 are antiferromagnetically coupled, the longitudinal biasing magnetic field can be applied to the both by providing the structure for applying the longitudinal biasing field for either thereof.

Figure 7:
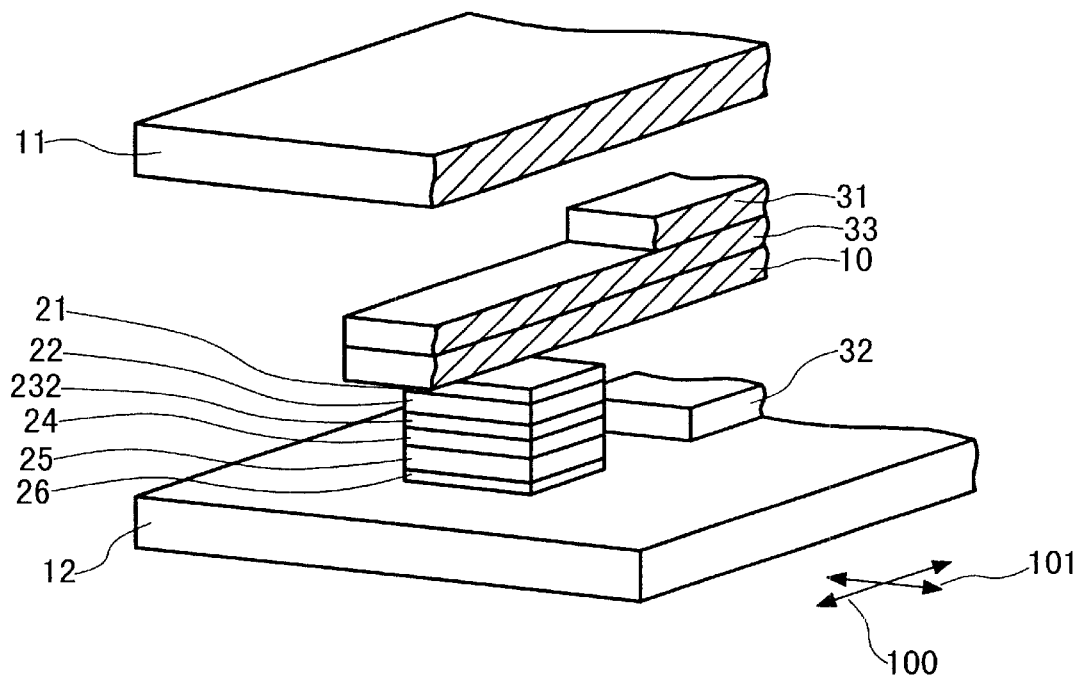
FIG. 7 is a cross sectional view illustrating another example of the magnetoresistive sensor in accordance with the present invention.
Figure 8:
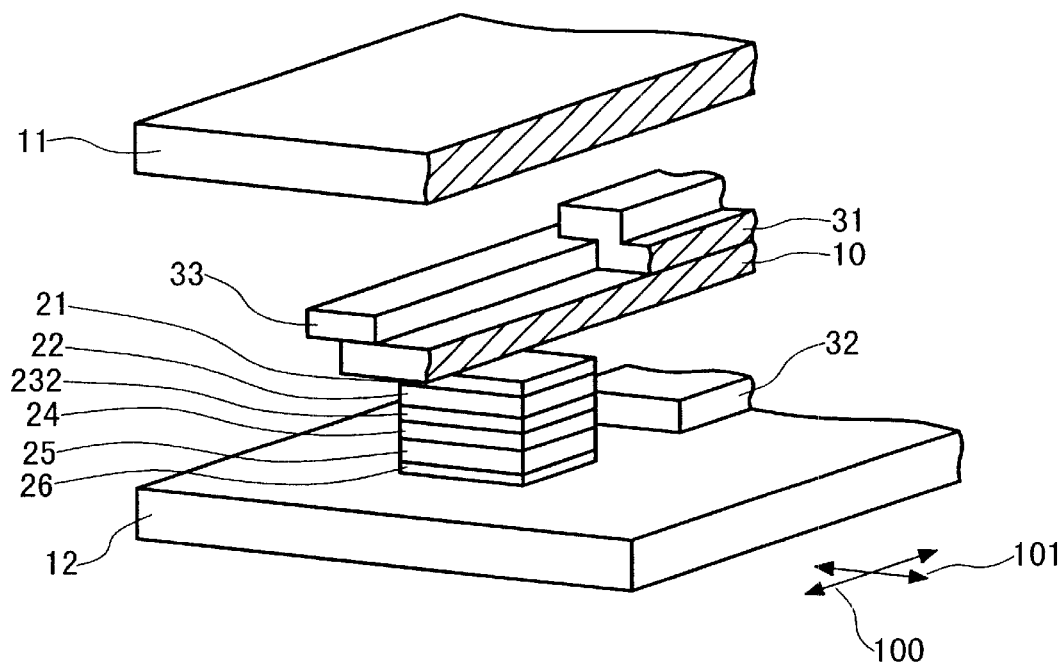
FIG. 8 is a cross sectional view illustrating another example of the magnetoresistive sensor in accordance with the present invention.
Figure 9:
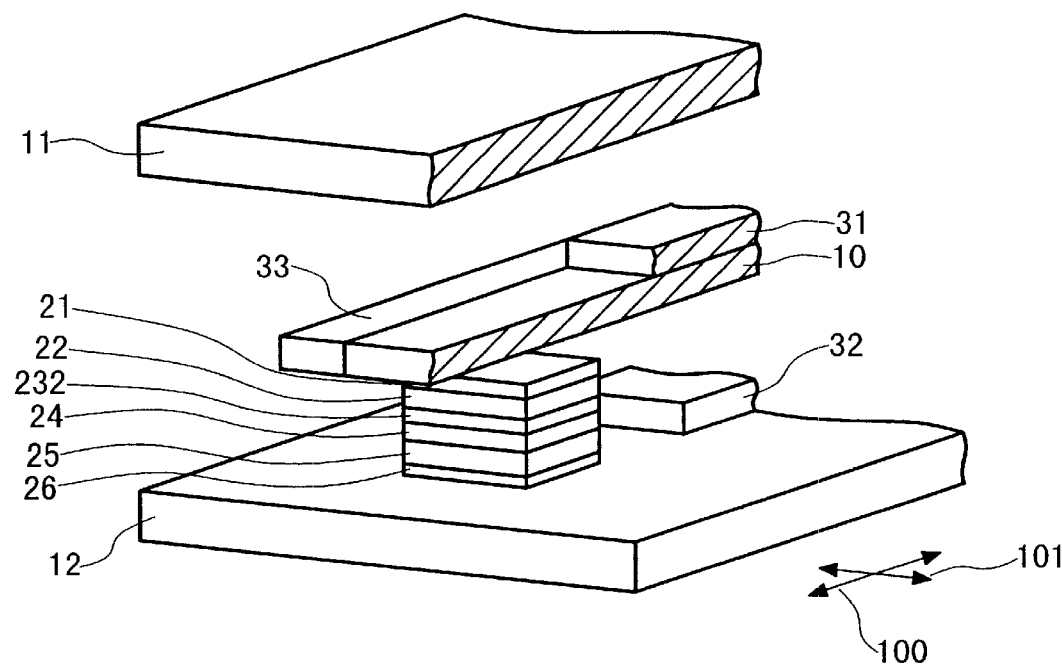
FIG. 9 is a cross sectional view illustrating another example of the magnetoresistive sensor in accordance with the present invention.

FIG. 7 is a view illustrating the structure in which the longitudinal biasing layer 33 is laminated on the magnetic flux guide 10, and FIG. 8 and FIG. 9 are views illustrating structures in which the longitudinal biasing layer 33 is provided for both ends and for both sides of the magnetic flux guide 10. The Barkhausen noise of both the magnetic flux guide 10 and the first ferromagnetic layer 22 can be suppressed in either structure.

A permanent magnet material can be employed for the longitudinal biasing layer 33. Typically, the layer in which a Co Cr Pt film is formed on a Cr underlayer can be set for it. In addition, CoCtTa, CoPt, CoCrPtTa, and materials produced by adding $ZrO_2$, $Al_2O_3$, $Ta_2O_5$ and the like thereto may be used. The film thickness of the longitudinal biasing layer 33 can be set in the range of 8 nm to 120 nm according to the film thickness of the free layer and a value of the residual magnetic flux density of the permanent magnet material. However, it is typically 30 nm to 40 nm. The magnetic properties are typically coercivity Hc: 2000 Oe, residual magnetic flux density Br: 0.8 T and squareness Br/Bs: 0.85 respectively, but are not limited thereto. The magnetization direction is the track-width direction.

Note that, herein the case was illustrated in which the magnetic flux guide of the magnetoresistive sensor employing the TMR film as the magnetoresistive sensor film was provided with the longitudinal biasing layer 33, but the magnetic flux guide of the magnetoresistive sensor employing the GMR sensor film shown in FIG. 2 can be also provided with the longitudinal biasing layer 33 in the same manner as FIG. 7 to FIG. 9, thereby being able to suppress the Barkhausen noise in both magnetic flux guide 10 and the free layer 22 of the GMR sensor film.

Fourth Embodiment

Figure 10:
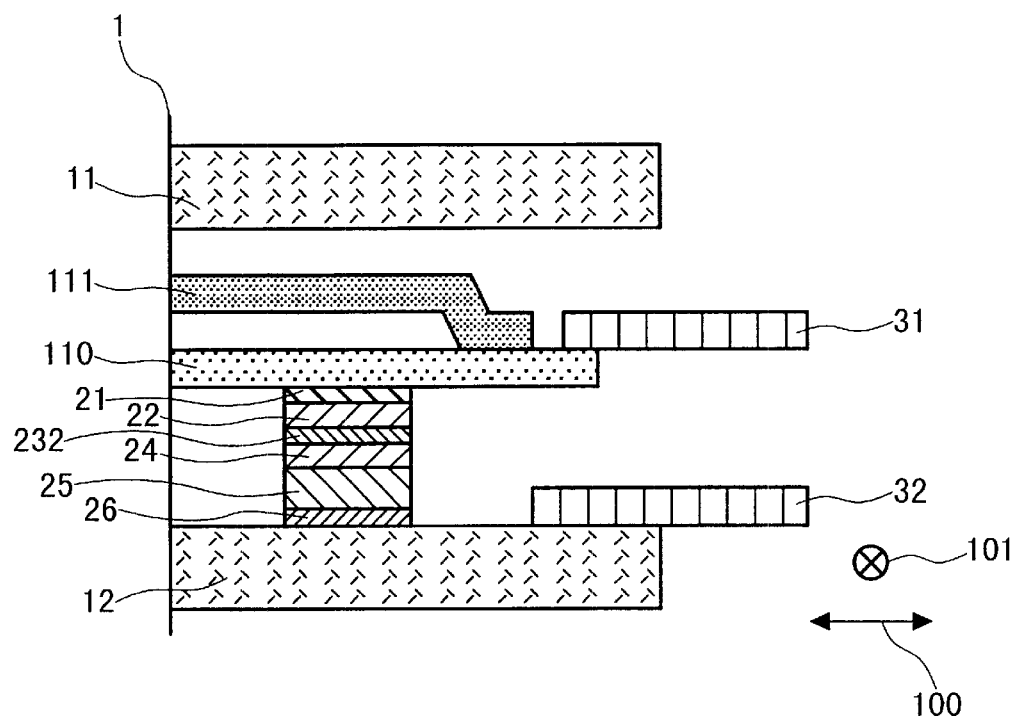
FIG. 10 is a cross sectional view illustrating another example of the magnetoresistive sensor in accordance with the present invention.

In the embodiment 3 one piece of the magnetic flux guide constitutes the magnetic flux guide 10, but as shown in FIG. 10 two portions of the first magnetic flux guide portion 110 and the second magnetic guide portion 111 may constitute the magnetic flux guide. One part of the first magnetic flux guide portion 110 is antiferromagnetically coupled to the first ferromagnetic layer 22 of the TMR sensor film via the nonmagnetic intermediate layer 21. The first magnetic flux guide portion 110 and the second magnetic guide portion 111 are in contact at more remote position in the head depth direction than the position in which the TMR sensor film is arranged, these magnetic flux guide portions 110 and 111 form a magnetic circuit, and thus the magnetic field entered from the medium flows through along the magnetic circuit. Such a constitution is preferred for the readout of the perpendicular magnetic recording. By the way, arrangement of the upper electrode 31 and the lower electrode 32 is not always limited to the present drawing as long as the sensing current can be supplied in the film-thickness direction of the TMR sensor.

Figure 11:
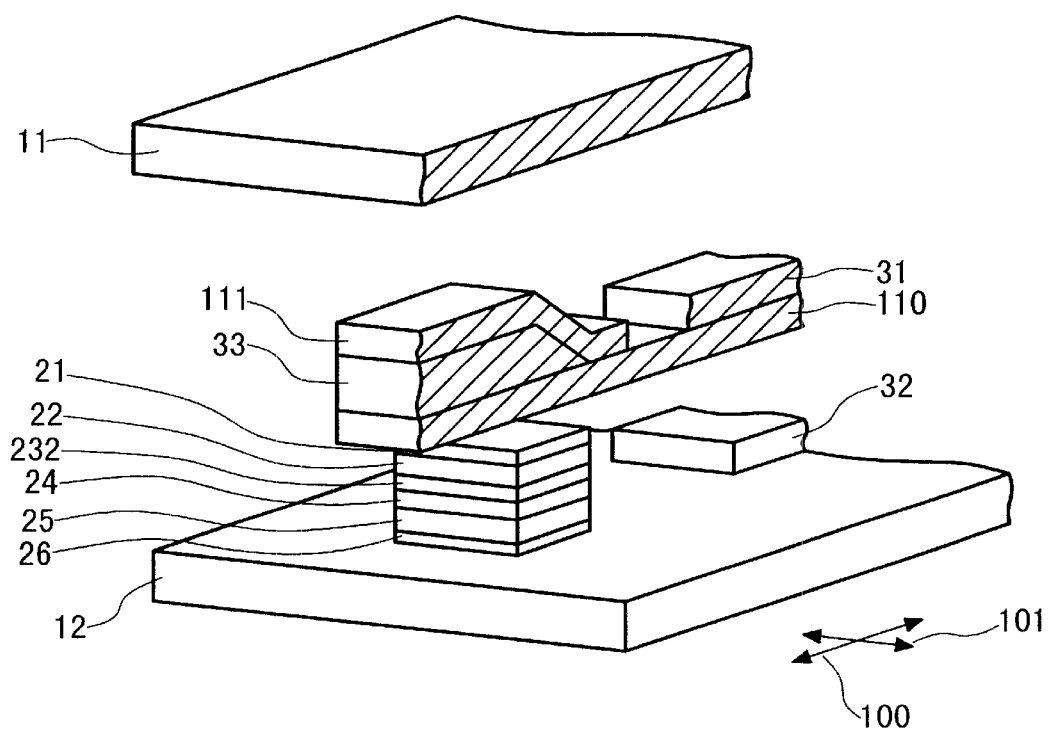
FIG. 11 is a cross sectional view illustrating another example of the magnetoresistive sensor in accordance with the present invention.
Figure 12:
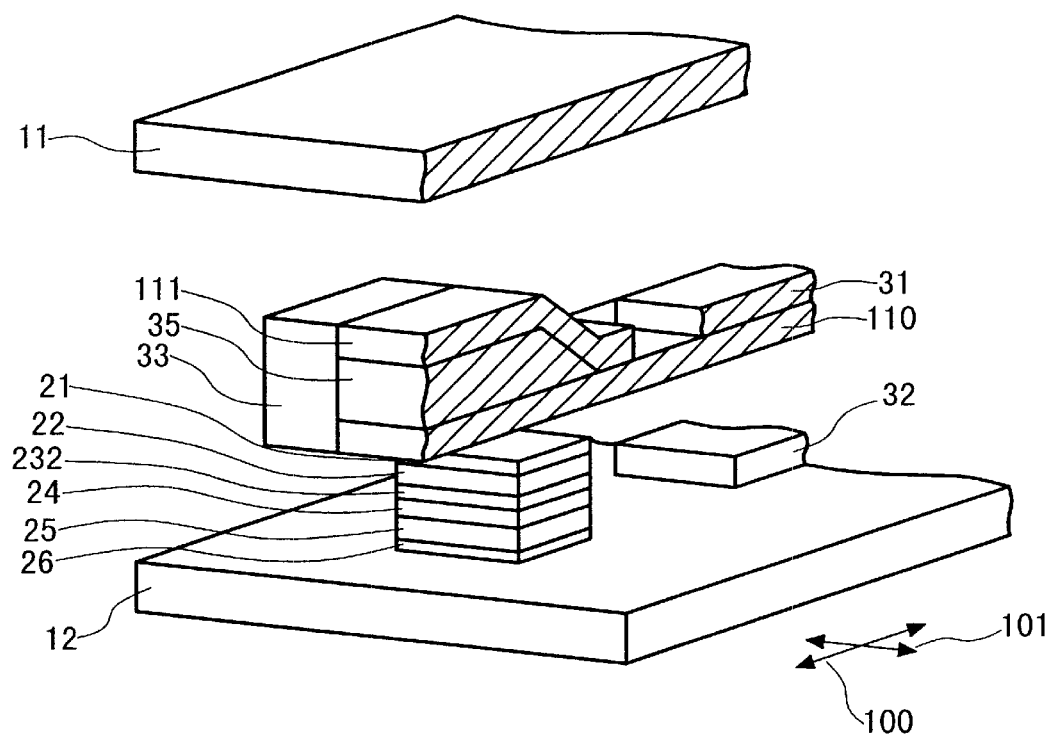
FIG. 12 is a cross sectional view illustrating another example of the magnetoresistive sensor in accordance with the present invention.
Figure 13:
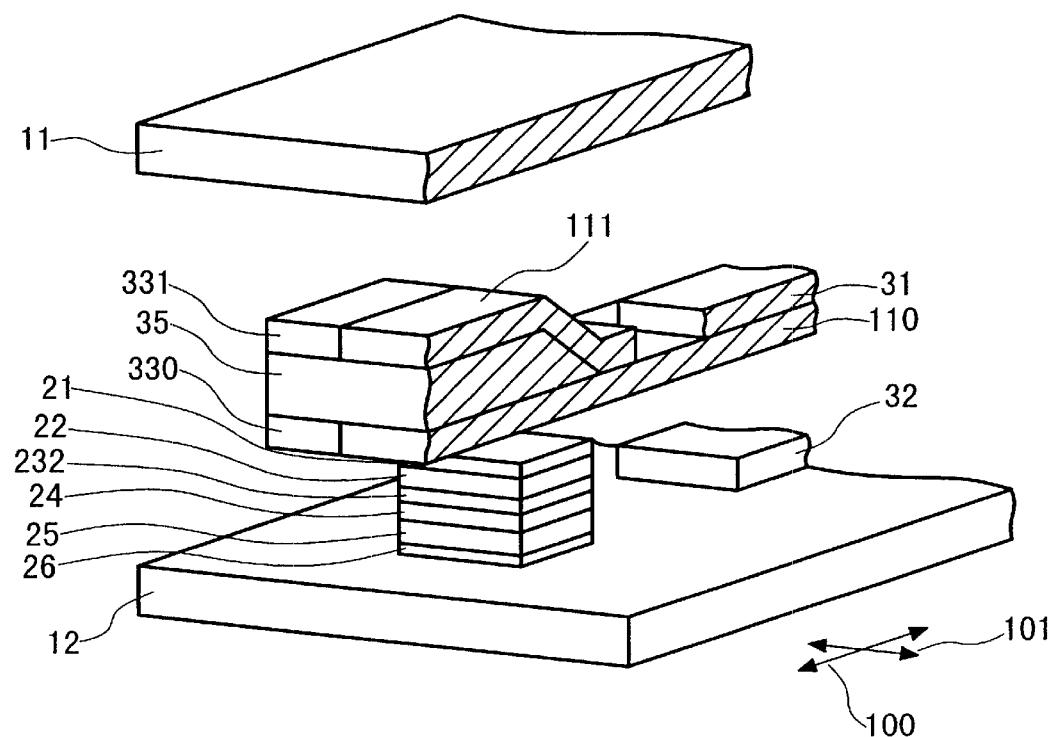
FIG. 13 is a cross sectional view illustrating another example of the magnetoresistive sensor in accordance with the present invention.

The structures are shown in FIG. 11 to FIG. 13 in which the longitudinal biasing layer is provided for the magnetic flux guide consisting of two portions of the first magnetic flux guide portion 110 and the second magnetic flux guide portion 111. In FIG. 11, the area interposed between the first magnetic flux guide portion 110 and the second magnetic guide portion 111 has been provided with the longitudinal biasing layer, thereby being able to suppress the Barkhausen noise of two magnetic flux guide portions and the first ferromagnetic layer 22 which is the free layer of the TMR sensor film. In FIG. 12, the area interposed between the first magnetic flux guide portion 110 and the second magnetic flux guide portion 111 has been provided with the nonmagnetic gap layer 35, and a pair of the longitudinal biasing layers 33 are provided for both sides of the two magnetic guide portions 110 and 111 and the nonmagnetic gap layer 35. Additionally, in FIG. 13, every pair of the longitudinal biasing layers 330 and 331 is provided for each of the both sides of two magnetic guide portions 110 and 111 respectively. In either structure, the Barkhausen noise can be suppressed of the first magnetic flux guide portion 110, the second magnetic guide portion 111 and the first free layer 22.

A merit of the structure in FIG. 11 is that a pattern can be formed at once after formation of the film of the magnetic flux guide 110, the longitudinal biasing layer 33 and the magnetic flux guide 111. However, there is a demerit that since the material constituting the magnetic flux guide 110 is typically a face-centered cubic (FCC) structure, large coercivity is difficult to obtain in forming of the permanent magnet film (longitudinal biasing layer) on it. It is the structures shown FIG. 12 or FIG. 13 that can overcome this difficulty. The structure of FIG. 13 has a demerit that the process becomes complex as compared with that of FIG. 12, but in the structure of FIG. 12, the film thickness of the longitudinal biasing magnetic field 33 enlarges, thereby possibly generating a unnecessarily large longitudinal biasing field, and accordingly in such a case, the two magnetic guide portions 110 and 111 may be provided with the longitudinal biasing magnetic fields 330 and 331 respectively as shown in FIG. 13.

Figure 14:
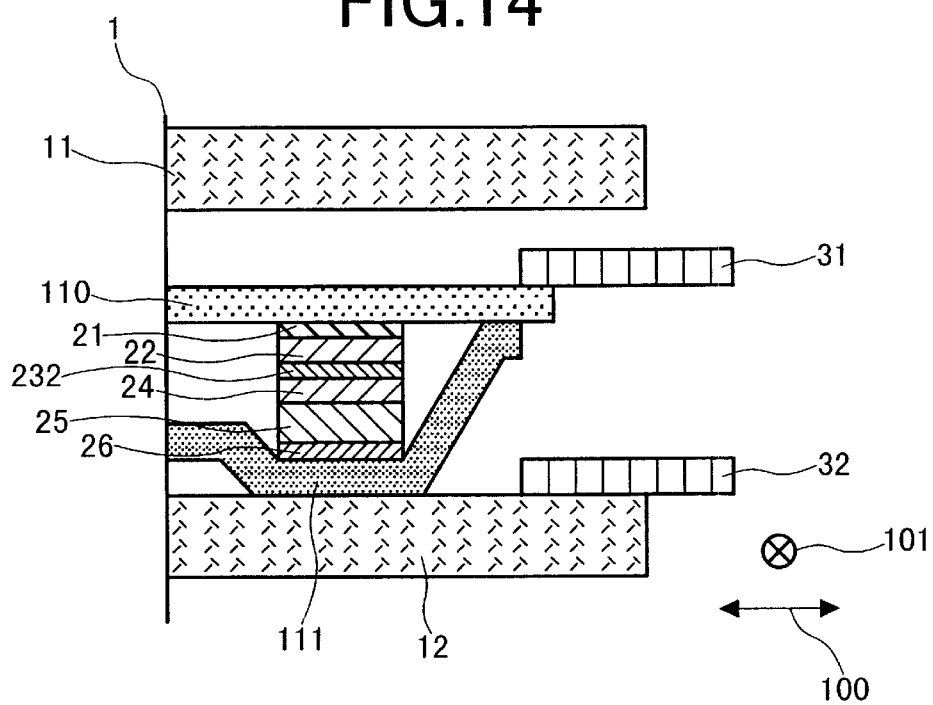
FIG. 14 is a view illustrating another cross sectional structure of the magnetoresistive sensor of the fourth embodiment in accordance with the present invention.

Additionally, the TMR sensor film also can be arranged inside the magnetic circuit formed by the first magnetic flux guide portion 110 and the second magnetic flux guide portion 111 as shown in FIG. 14. However, in this case, the second magnetic flux guide portion 111 needs to be formed in a soft magnetic film, for example, the discontinuous multi-layer film of the magnetic material and the oxide so that the sensing current does not flow from the upper electrode 31 through the second magnetic flux guide portion 111, to the lower electrode 32 to short-circuit. With respect to the longitudinal biasing layer in this structure, as shown in FIG. 13, the longitudinal biasing layer is preferably provided for each of two magnetic flux guide portions. Additionally, when the structure shown in FIG. 14 is employed, a gap between the upper shield layer 11 and the lower shield layer 12 can be narrowed like the relation between FIG. 3 and FIG. 4.

Note that, in the present embodiment, the case was described in which the magnetic flux guide of the magnetoresistive sensor employing the TMR film as the magnetoresistive sensor film was provided with the longitudinal biasing layer, but the magnetic flux guide of the magnetoresistive sensor employing the GMR sensor film shown in FIG. 4 also can be provided with the longitudinal biasing layer in the same manner to FIG. 11 to FIG. 13, thereby being able to suppress the Barkhausen noise of both the magnetic flux guide 10 and the first ferromagnetic layer 22 of the GMR sensor film.

Fifth Embodiment

Figure 15:
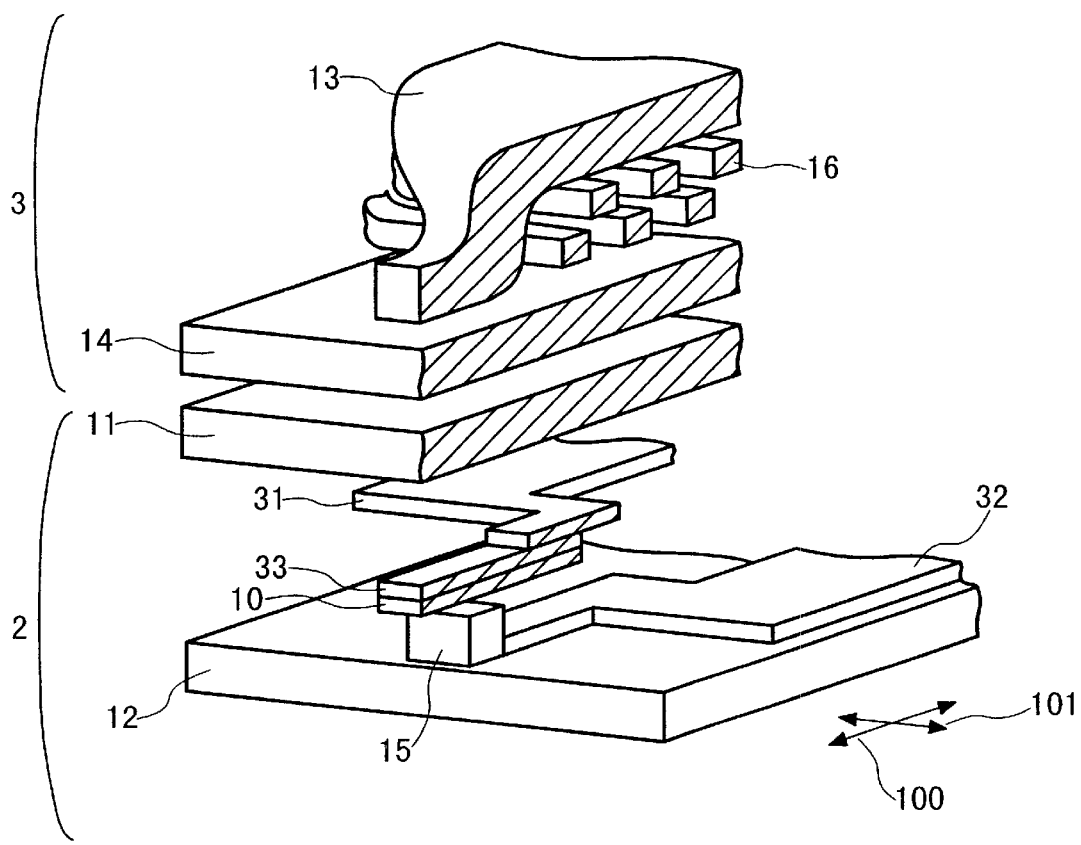
FIG. 15 is a bird's-eye and cross sectional view illustrating the structure of the magnetic head in accordance with the present invention.

FIG. 15 is a partial cross sectional side view illustrating the structure of the magnetic head in accordance with the present invention. As shown in FIG. 15, the magnetic head in correspondence with a higher recording density can be provided by employing the magnetoresistive sensor using the magnetoresistive sensor film shown in the above-mentioned embodiment as the read-back element 2 to provide thereon the recording element 3 consisting of a pair of the magnetic cores of the lower core 14 and the upper core 13 and a coil 16 crossing the magnetic cores.

Figure 16:
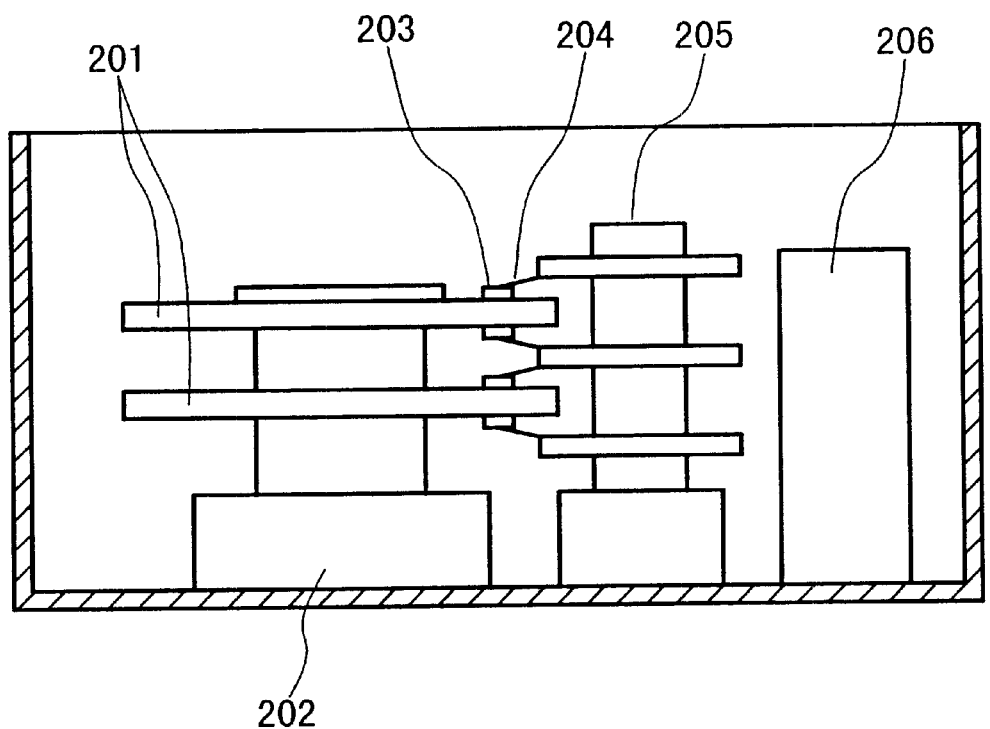
FIG. 16 is a schematic drawing illustrating the magnetic disk apparatus in accordance with the present invention.

Additionally, by employing such a magnetic head the magnetic disk apparatus with a high recording density can be provided. FIG. 16 is a schematic drawing illustrating one embodiment thereof. The magnetic disk apparatus comprises: a magnetic recording medium 201 for magnetically recording information; a motor 202 for rotating it; a magnetic head 203 for reading/writing information to the magnetic recording medium 201; a suspension for supporting it; an actuator for positioning the magnetic head; a read/write circuit for processing information (read/write signal); and the like. The magnetic disk apparatus with a high recording density can be realized by employing the magnetic head shown in FIG. 15 as the magnetic head 203.

Additionally, combination of a plurality of the above-mentioned magnetic disk apparatuses allows a disk array apparatus to be assembled. In this case, information-processing power can be increased and reliability of the apparatus can be improved since a plurality of the magnetic disk apparatuses operate simultaneously.

In the embodiments described above, the magnetic flux guide is provided on the magnetoresistive sensor film, but the advantage of the present invention is not lost in the structure as well in which the first ferromagnetic layer which is the free layer, the nonmagnetic conductive layer or the tunnel barrier layer, the second ferromagnetic layer, and the antiferromagnetic layer are laminated via the nonmagnetic intermediate layer on the magnetic flux guide. Additionally, even though after formation of the recording element the read-back element is mounted thereon, it is the same.

In accordance with the present invention, in the structures in which the magnetic flux guide is employed without exposing the magnetoresistive sensor film such as the GMR film and the TMR film to the air bearing surface, sensitivity can be improved by antiferromagnetically coupling the magnetic flux guide to the free layer and high stability can be obtained by applying the longitudinal biasing magnetic field to both the magnetic flux guide film and the free layer of the magnetoresistive sensor film.

What is claimed is:

1. A magnetoresistive sensor comprising:
    a magnetoresistive sensor film having a ferromagnetic layer whose magnetization rotates in response to magnitude of an applied magnetic field;
    a pair of electrodes for flowing a signal sensing current to said magnetoresistive sensor film; and
    a magnetic flux guide for guiding a leakage flux from a magnetic recording medium to said magnetoresistive sensor film,
    wherein said ferromagnetic layer of said magnetoresistive sensor film whose magnetization rotates in response to magnitude of the applied magnetic field is antiferromagnetically coupled to said magnetic flux guide.

2. The magnetoresistive sensor according to claim 1, wherein said ferromagnetic layer of said magnetoresistive sensor film whose magnetization rotates in response to magnitude of the applied magnetic field is antiferromagnetically coupled to said magnetic flux guide via a nonmagnetic intermediate layer made of Ru, Cr, Rh, Tr, or alloys thereof.

3. The magnetoresistive sensor according to claim 2, wherein said magnetic flux guide consists of a first magnetic flux guide portion and a second magnetic flux guide portion, said first magnetic flux guide portion and said second magnetic flux guide portion being continuous from said air bearing surface towards a depth direction and being magnetically connected at a farther position from said air bearing surface than the position of said magnetoresistive sensor film in the depth direction.

4. The magnetoresistive sensor according to claim 1, wherein said magnetic flux guide consists of a first magnetic flux guide portion and a second magnetic flux guide portion, said first magnetic flux guide portion and said second magnetic flux guide portion being continuous an said air bearing surface towards a depth direction and being magnetically connected at a farther position from said air bearing surface than the position of said magnetoresistive sensor film in the depth direction.

5. The magnetoresistive sensor according to claim 1, wherein said magnetic flux guide is provide with a longitudinal biasing layer for suppressing a Barkhausen noise.

6. The magnetoresistive sensor according to claim 1, wherein said magnetoresistive sensor film further comprises:

another ferromagnetic layer, wherein said ferromagnetic layer and said another ferromagnetic layer have been laminated to each other via a tunnel barrier layer, wherein a magnetization of said ferromagnetic layer rotating in response to the applied magnetic field, and a relative angle of the magnetization direction of said ferromagnetic layer to that of said another ferromagnetic layer varies to change electric resistance.

7. The magnetoresistive sensor according to claim 1, wherein said magnetoresistive sensor film further comprises:

another ferromagnetic layer;

wherein said ferromagnetic layer and said another ferromagnetic layer, have been laminated to each other via a a nonmagnetic conductive layer, and wherein a magnetization of said ferromagnetic layer rotating in response to the applied magnetic field, and a relative angle of the magnetization direction of said ferromagnetic layer to that of said another ferromagnetic layer varies to change electric resistance.

8. A magnetic head comprising:

a read-head, wherein said read-head comprises:

a magnetoresistive sensor film having a ferromagnetic layer whose magnetization rotates in response to magnitude of an applied magnetic field, a pair of electrodes for flowing a signal sensing current to said magnetoresistive sensor film, and a magnetic flux guide for guiding leakage flux from a magnetic recording medium to said magnetoresistive sensor film, wherein said magnetic flux guide being antiferromagnetically coupled to said ferromagnetic layer of said magnetoresistive sensor film whose magnetization rotates in response to magnitude of the applied magnetic field.

9. The magnetic head according to claim 8, wherein said magnetoresistive sensor film further comprises:

another ferromagnetic layer, wherein said ferromagnetic layer and said another ferromagnetic layer have been laminated to each other via a tunnel barrier layer, wherein said ferromagnetic layer being a magnetoresistive sensor film whose magnetization rotates in response to magnitude of the applied magnetic field, and wherein said magnetic flux guide is antiferromagnetically coupled to said ferromagnetic layer of said magnetoresistive sensor film via a nonmagnetic intermediate layer made of Ru, Cr, Rh, Ir, or alloys thereof to guide leakage flux from the magnetic recording medium to said magnetoresistive sensor film.

10. The magnetic head according to claim 8, wherein said magnetoresistive sensor film further comprises:

another ferromagnetic layer, wherein said ferromagnetic layer and said another ferromagnetic layer have been laminated to each other via a tunnel barrier layer, wherein a magnetization of said ferromagnetic layer rotates in response to magnitude of the applied magnetic field, and a relative angle of the magnetization direction of said ferromagnetic layer to said another ferromagnetic layer varying to change electric resistance, and wherein said magnetic flux guide is antiferromagnetically coupled to said ferromagnetic layer via a nonmagnetic intermediate layer made of Ru, Cr, Rh, Ir, or alloys thereof to guide leakage flux from the magnetic recording medium to said magnetoresistive sensor film.

11. The magnetic head according to claim 8, wherein said magnetic flux guide is provided with a longitudinal biasing layer for suppressing a Barkhausen noise.

12. The magnetic head according to claim 8, wherein said magnetoresistive sensor film further comprises:

another ferromagnetic layer, wherein said ferromagnetic layer and said another ferromagnetic layer have been laminated to each other via a nonmagnetic conductive layer, wherein the magnetization of said ferromagnetic layer rotates in response to magnitude of the applied magnetic field, and a relative angle of the magnetization direction of said ferromagnetic layer to said another ferromagnetic layer varying to change electric resistance, and wherein said magnetic flux guide is antiferromagnetically coupled to said ferromagnetic layer via a nonmagnetic intermediate layer made of Ru, Cr, Rh, Ir, or alloys thereof to guide leakage flux from the magnetic recording medium to said magnetoresistive sensor film.

13. A magnetic disk apparatus comprising:

a magnetic recording apparatus including:

a magnetic recording medium;

a magnetic head including a recording unit and a read-back unit;

driving means for letting said magnetic head make a relative motion to said magnetic recording media; and read/write signal processing means, wherein said read-back unit of said magnetic head comprises;

a magnetoresistive sensor film including a ferromagnetic layer whose magnetization rotates in response to magnitude of an applied magnetic field;

a pair of electrodes for flowing a signal sensing current to said magnetoresistive sensor film; and a magnetic flux guide for guiding leakage flux from said magnetic recording medium to said magnetoresistive sensor film, said magnetic flux guide being antiferromagnetically coupled to the ferromagnetic layer of said magnetoresistive sensor film whose magnetization rotates in response to magnitude of the applied magnetic field.

14. The magnetic disk apparatus according to claim 13, wherein said magnetoresistive sensor film further comprises:

another ferromagnetic layer, wherein said ferromagnetic layer, a nonmagnetic layer, said another ferromagnetic layer, and an antiferromagnetic layer have been formed in order, and wherein said first-ferromagnetic layer and said magnetic flux guide being formed via the nonmagnetic intermediate layer made of Ru, Cr, Rh, Ir, or alloys thereof.

15. The magnetic disk apparatus according to claim 14, wherein said nonmagnetic layer is a tunnel barrier layer.

\* \* \* \* \*